(12) United States Patent
Kim et al.

(10) Patent No.: US 10,566,576 B2
(45) Date of Patent: Feb. 18, 2020

(54) DISPLAY PANEL WITH LUMINANCE EFFICIENCY IMPROVEMENT, DISPLAY DEVICE, AND METHOD OF FABRICATING THE DISPLAY PANEL

(71) Applicant: LG DISPLAY CO., LTD., Seoul (KR)

(72) Inventors: Eui-Tae Kim, Paju-si (KR); Ki-Seob Shin, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 461 days.

(21) Appl. No.: 15/331,092

(22) Filed: Oct. 21, 2016

(65) Prior Publication Data
US 2017/0179437 A1 Jun. 22, 2017

(30) Foreign Application Priority Data
Dec. 21, 2015 (KR) .................. 10-2015-0183216

(51) Int. Cl.
*H01L 51/52* (2006.01)
*G09G 3/3208* (2016.01)
*H01L 27/32* (2006.01)

(52) U.S. Cl.
CPC ....... *H01L 51/5275* (2013.01); *G09G 3/3208* (2013.01); *H01L 27/322* (2013.01); *H01L 27/3246* (2013.01); *H01L 51/5271* (2013.01); *H01L 51/5284* (2013.01); *G09G 2300/0452* (2013.01); *H01L 2227/323* (2013.01)

(58) Field of Classification Search
CPC .............. H01L 27/322; H01L 27/3246; H01L 51/5271; H01L 51/5275; H01L 51/5284; H01L 2227/323; G09G 3/3208; G09G 2300/0452
See application file for complete search history.

(56) References Cited

U.S. PATENT DOCUMENTS

| | | | | |
|---|---|---|---|---|
| 8,816,363 B2 * | 8/2014 | Isobe | ................. | H01L 51/5088 257/184 |
| 9,947,731 B2 * | 4/2018 | Jiao | ..................... | H01L 27/3246 |
| 2004/0004594 A1 * | 1/2004 | Kato | ................. | G02F 1/133603 345/87 |
| 2007/0145892 A1 * | 6/2007 | Chen | ................... | H01L 51/5271 313/506 |
| 2007/0278493 A1 * | 12/2007 | Sato | ....................... | H05B 33/22 257/72 |
| 2008/0296591 A1 * | 12/2008 | Lin | ................... | H01L 27/14665 257/88 |

(Continued)

FOREIGN PATENT DOCUMENTS

| | | |
|---|---|---|
| CN | 104282715 A | 1/2015 |
| JP | 2003-248444 A | 9/2003 |

(Continued)

*Primary Examiner* — Amare Mengistu
*Assistant Examiner* — Crystal Mathews
(74) *Attorney, Agent, or Firm* — Dentons US LLP

(57) ABSTRACT

This disclosure provides a display panel including a first substrate with pixel areas and emission areas defined by a plurality of gate lines and a plurality of data lines; and a second substrate on which partitions are formed to correspond with the emission areas. The present disclosure provides a method for improving luminance efficiency of a display device having a mirror or transmittance function.

17 Claims, 14 Drawing Sheets

(56) References Cited

U.S. PATENT DOCUMENTS

| | | | | |
|---|---|---|---|---|
| 2009/0269866 A1* | 10/2009 | Lee | ................. | H01L 51/0013 |
| | | | | 438/29 |
| 2011/0079797 A1* | 4/2011 | Sumida | ............... | H01L 51/5275 |
| | | | | 257/88 |
| 2012/0091441 A1* | 4/2012 | Matsushima | ....... | H01L 27/3211 |
| | | | | 257/40 |
| 2013/0214301 A1 | 8/2013 | Yamada et al. | | |
| 2015/0008399 A1 | 1/2015 | Choi et al. | | |
| 2015/0008403 A1 | 1/2015 | Kudo et al. | | |
| 2015/0090991 A1 | 4/2015 | Ishii et al. | | |
| 2015/0090992 A1* | 4/2015 | Miyazawa | .......... | H01L 51/5271 |
| | | | | 257/40 |
| 2015/0188091 A1 | 7/2015 | Kudo et al. | | |
| 2015/0318447 A1 | 11/2015 | Choi | | |
| 2016/0005870 A1* | 1/2016 | Huang | ................. | H01L 29/786 |
| | | | | 257/43 |
| 2016/0276420 A1* | 9/2016 | Oooka | ................. | H01L 51/525 |
| 2016/0372528 A1* | 12/2016 | Kamura | ............. | H01L 51/0096 |
| 2017/0033164 A1* | 2/2017 | Liu | ................. | H01L 27/322 |
| 2017/0069271 A1* | 3/2017 | Kim | ................. | H01L 27/124 |
| 2017/0309798 A1* | 10/2017 | Bonar | ................. | H01L 27/156 |
| 2018/0005568 A1* | 1/2018 | Kim | ................. | G09G 3/3208 |
| 2018/0226016 A1* | 8/2018 | Suzuki | ................. | G09F 9/30 |

FOREIGN PATENT DOCUMENTS

| | | | |
|---|---|---|---|
| JP | 2003-282259 | A | 10/2003 |
| JP | 2004-014982 | A | 1/2004 |
| JP | 2009-110873 | A | 5/2009 |
| JP | 2010-191466 | A | 9/2010 |
| JP | 2014-096346 | A | 5/2014 |
| JP | 2015-069861 | A | 4/2015 |

\* cited by examiner

DISPLAY PANEL WITH LUMINANCE EFFICIENCY IMPROVEMENT, DISPLAY DEVICE, AND METHOD OF FABRICATING THE DISPLAY PANEL

CROSS-REFERENCE TO RELATED APPLICATION

This application claims priority from Korean Patent Application No. 10-2015-0183216, filed on Dec. 21, 2015, which is hereby incorporated by reference for all purposes as if fully set forth herein.

BACKGROUND OF THE INVENTION

Field of the Invention

The present invention relates to a display panel with improved luminance efficiency, a display device including the display panel, and a method of fabricating the display panel.

Description of the Related Art

A display device, such as a liquid crystal display, an electrophoretic display, an organic light emitting display, an inorganic electroluminescent (EL) display, an electroluminescent display, a field emission display, a surface conduction electron emitter display, a plasma display, a cathode ray display and the like, is a device that visually displays data.

Among these displays, the organic light emitting display includes two different electrodes and an emission layer interposed therebetween. In this display, when electrons generated in one electrode and holes generated in the other electrodes are injected into the emission layer, the injected electrons and holes combine to generate excitons. Light is generated when these excitons emit energy as they fall from an excited state to a ground state, thereby displaying an image.

Some display devices may have a mirror function, where external light is reflected by a reflective material formed, or located, in a display panel, or a transmission function, where external light is transmitted through the display panel.

However, such a mirror function or transmission function may deteriorate luminance efficiency of light emitted from the pixels of the display panel. Therefore, a display panel and a display device capable of improving luminance efficiency are needed.

SUMMARY OF THE INVENTION

The present disclosure provides a display panel, and a display device including the display panel, capable of improving luminance efficiency of a display panel having a mirror function or a transmission function, and a method for fabricating such a display panel.

In addition, the present disclosure provides a display panel and a display device capable of outputting light emitted from an emission area to the outside the display panel without being reflected by a mirror, and a method for fabricating such a display panel.

In addition, the present disclosure provides a display panel and a display device capable of outputting light emitted from an emission area to the outside the display panel without being totally reflected at an upper substrate, and a method for fabricating such a display panel.

In addition, the present disclosure provides a display panel and a display device capable of adjusting a viewing angle of light emitted from an emission area, and a method for fabricating such a display panel.

The present invention provides a display panel comprising: a first substrate on which a plurality of gate lines, a plurality of data lines, a plurality of pixels formed by the intersection of the gate lines and the data lines, and a plurality of banks defining an emission area of each of the plurality of pixels are positioned, and a second substrate on which a plurality of partitions are positioned such that the partitions correspond to the plurality of banks, wherein a refractive index of each of the plurality of partitions is lower than a refractive index of a material interposed between the emission area and the second substrate.

In other words, the plurality of the partitions and the plurality of banks may be formed, or located, such that the plurality of partitions and the plurality of banks at least partially define a space between the emission area and the second substrate, and the material interposed between the emission area and the second substrate is in the space.

An exemplary aspect of the present disclosure provides a display panel including: a first substrate with a plurality of pixel areas and emission areas which are defined by a plurality of gate lines and a plurality of data lines; and a second substrate with a plurality of partitions.

According to an exemplary aspect of the present disclosure, the partitions of the second substrate may have a reverse taper structure, a multi-step reverse taper structure or a concave groove structure.

Another exemplary embodiment of the present disclosure provides a display device having a structure which is capable of outputting light emitted from an emission area to the outside of a display panel by means of partitions.

The display device may include a display panel having a transparent substrate on which partitions having a reverse tapered structure are positioned.

Another exemplary embodiment of the present disclosure provides a method for fabricating a display panel, including forming a plurality of banks defining an emission area on a first substrate; and forming a plurality of partitions on a second substrate in a region corresponding to the plurality of banks, such that the plurality of the partitions and the banks may define a space between the emission area and the second substrate, as described herein. The method may further include forming partitions which have a reverse tapered structure, a multi-step reverse taper structure or a concave groove structure. The method may also include coating a negative photoresist on the second substrate and then forming the plurality of partitions by exposing the coated negative photoresist. According to exemplary embodiments of the present disclosure, it is possible to fabricate the partitions and the bank using a common photomask, thereby reducing production costs.

An exemplary embodiment of the present disclosure provides a display panel comprising: a first substrate on which a plurality of gate lines, a plurality of data lines, a plurality of pixels defined by the intersection of the plurality of gate lines and the plurality of data lines, and a plurality of banks are located, the plurality of banks defining emission areas of the plurality of pixels; and a second substrate on which a plurality of partitions are located at positions corresponding to the location of the plurality of banks, and a refractive index of plurality of partitions is lower than a refractive index of a material interposed between the emission area and the second substrate.

An exemplary embodiment of the present disclosure further provides a display panel, wherein a material interposed between the emission area and the second substrate is an adhesive material, and the refractive index of the plurality of partitions is lower than a refractive index of the adhesive material.

An exemplary embodiment of the present disclosure further provides a display panel, where an angle formed between a section of the second substrate in contact with at least one of the plurality of partitions and a side wall of the at least one of the plurality of partitions is equal to or greater than 90 degrees.

An exemplary embodiment of the present disclosure further provides a display panel, where a side wall of the partitions has a concave polygonal shape or a concave arc shape.

An exemplary embodiment of the present disclosure further provides a display panel, where a reflective material is located on the second substrate in a region corresponding to each of the plurality of banks of the first substrate.

An exemplary embodiment of the present disclosure further provides a display panel, where the gate lines and data lines on the first substrate are made of a transparent conductive material, and the light transmittance of the region corresponding to the plurality of banks in the second substrate is equal to or higher than the light transmittance of the emission area in the first substrate.

An exemplary embodiment of the present disclosure further provides a display panel, where a color filter is interposed between two partitions, such that the color filter is lower than or flush with the two partitions.

Another exemplary embodiment of the present disclosure provides a display device comprising a display panel; a first driver configured to apply a data signal to the data lines; a second driver configured to apply a gate signal to the gate lines; and a timing controller configured to control the first driver and the second driver.

An exemplary embodiment of the present disclosure provides a display device with an adhesive material interposed in the emission area, and the adhesive material bonding the first and second substrates together, and the refractive index of the plurality of partitions is lower than a refractive index of the adhesive material.

An exemplary embodiment of the present disclosure further provides a display device, where an angle formed between a section where the second substrate is in contact with at least one of the plurality of partitions and a side wall of the at least one partition is equal to or greater than 90 degrees.

An exemplary embodiment of the present disclosure further provides a display device, where the emission area and the bank region in the first substrate are both transparent.

A exemplary embodiment of the present disclosure is directed to a method for fabricating a display panel, comprising: forming a plurality of gate lines, a plurality of data lines, a plurality of pixels defined by the intersection of the plurality of gate lines and data lines and a bank on a first substrate, where the plurality of banks define emission areas of the plurality of pixels; forming a plurality of partitions on a second substrate corresponding to bank formed on the first substrate; and bonding the first substrate and the second substrate together. A refractive index of the plurality of partitions is lower than a refractive index of a material interposed between the emission area and the second substrate.

An exemplary embodiment of the present disclosure further provides a method where the step of bonding the first and second substrates further includes forming an adhesive material in the emission area of the first substrate or in a region of the second substrate where no partition is formed, and the refractive index of the plurality of partitions is lower than a refractive index of the adhesive material.

An exemplary embodiment of the present disclosure further provides a method, where the step of forming the plurality of partitions includes: depositing a negative photoresist on the second substrate; and exposing the negative photoresist using a photomask corresponding to the bank of the first substrate to form the plurality of partitions.

An exemplary embodiment of the present disclosure further provides a method, where the step of exposing the negative photoresis includes: exposing the negative photoresist by using a halftone photomask or a multi-tone photomask or by adjusting exposure time or exposure amount.

An exemplary embodiment of the present disclosure further provides a method further comprising: forming a color filter lower than or flush with the plurality of partitions on the second substrate in a region corresponding to the emission area.

DETAILED DESCRIPTION

Figure 1:
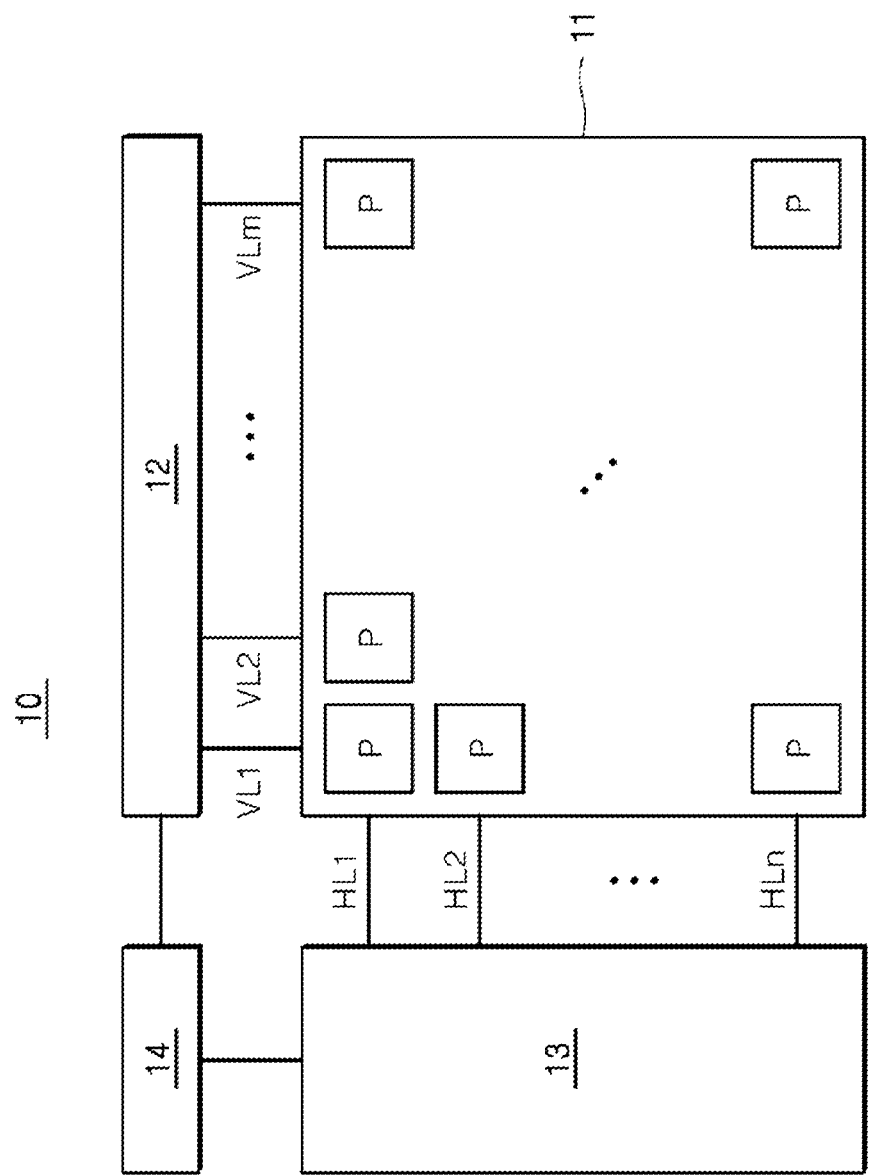
FIG. 1 is a schematic view illustrating the configuration of a display device according to an exemplary embodiment of the present disclosure.

The above objects, features and advantages will become more clearly apparent from the following detailed description in conjunction with the accompanying drawings. Therefore, the technical ideas of the present disclosure can be easily understood and practiced by those skilled in the art. In assigning reference numerals to elements in the drawings, the same elements will be designated by the same reference numerals as far as possible although they are illustrated in different drawings.

In addition, terms, such as first, second, A, B, (a), (b) or the like may be used herein in describing elements of the present invention. Each of these terminologies is not used to define an essence, order or sequence of a corresponding component but used merely to distinguish the corresponding component from other component(s). In the case that it is described that a certain element "is connected to", "is coupled to", or "is connected with" another element, it should be understood that not only can the certain element be directly connected or coupled to the another element, but an additional element may also be "interposed" between the elements or the elements may be connected or coupled to each other through an additional element. A "reverse taper" may be any taper that results in an overhanging structure.

However, the present disclosure is not limited to the following disclosures, and should be construed as including various modifications and changes in form, such as combination, separation, substitution, and change of a configuration without departing from the essential features of the present disclosure.

In the following detailed description of the exemplary embodiments of the present disclosure, descriptions of related functions or constructions, or well-known functions and configurations, will be omitted if such descriptions may hinder the understanding of the present disclosure.

A display device of the present disclosure externally outputs and image by using a variety of light sources based on input image data. The input image data are converted into R (red), G (green), B (blue), and selectively W (white) or black pixels to be provided to the display device. The display device may provide other functions. For example, the display device may further include a function of sensing light, thereby making it possible to adjust the luminance or color balance of the output images depending on a magnitude of the external light sensed by the display device.

FIG. 1 is a schematic view of a display device according to one embodiment of the present disclosure. The display device of FIG. 1 may include, but is not limited to, an organic light emitting display panel 11, which may be a top surface emission type or a bottom surface emission type display panel.

Referring to FIG. 1, a display device 10 includes a display panel 11 having a plurality of first lines VL1 to VLm formed, or located, in a first direction (for example, a vertical direction) and a plurality of second lines HL1 to HLn formed, or located, in a second direction (for example, a horizontal direction), a first driver 12 for applying a first signal to the plurality of first lines VL1 to Vlm, a second driver 13 for applying a second signal to the plurality of second lines HL1 to HLn, and a timing controller 14 for controlling the first driver 12 and the second driver 13. The display panel 11 has a plurality of pixels defined at intersections of the plurality of first lines VL1 to VLm and the plurality of second lines HL1 to HLn.

Each of the first and second drivers 12 and 13 may include at least one driver integrated circuit IC which outputs a signal for displaying an image.

The plurality of first lines VL1 to VLm may be, for example, data lines which are formed, or located, in the vertical direction (the first direction) and transfer a data voltage (the first signal) to a pixel column in the vertical direction. The first driver 12 may be a data driver for applying the data voltage to the data lines.

The plurality of second lines HL1 to HLn may be gate lines which are formed, or located, in the horizontal direction (the second direction) and transfer a scan signal (the second signal) to the pixel column in the horizontal direction. The second driver 13 may be a scan driver for applying the scan signal to the gate lines.

The display panel 11 may include a pad part (not shown) to interconnect the first driver 12 and the second driver 13. When the first signal is applied from the first driver 12 to the plurality of first lines VL1 to VLm, the pad part transfers the first signal to the display panel 11. Similarly, when the second signal is applied from the second driver 13 to the plurality of second lines HL1 to HLn, the pad part transfers the second signal to the display panel 11.

Each of the pixels includes one or more subpixels. A subpixel, as used herein, refers to a unit which allows an organic light emitting element to emit light of a particular color through a certain kind of color filter formed, or located, therein or without any color filter. Colors defined in the subpixel may include, but is not limited to, red (R), green (G), blue (B) and optionally white (W). Each subpixel includes a separate thin film transistor and an electrode connected thereto. Therefore, in the following description, one or more subpixels constituting a pixel will be collectively referred to as one pixel region, and for convenience, such groups of subpixels will be referred to as a pixel.

Figure 2:
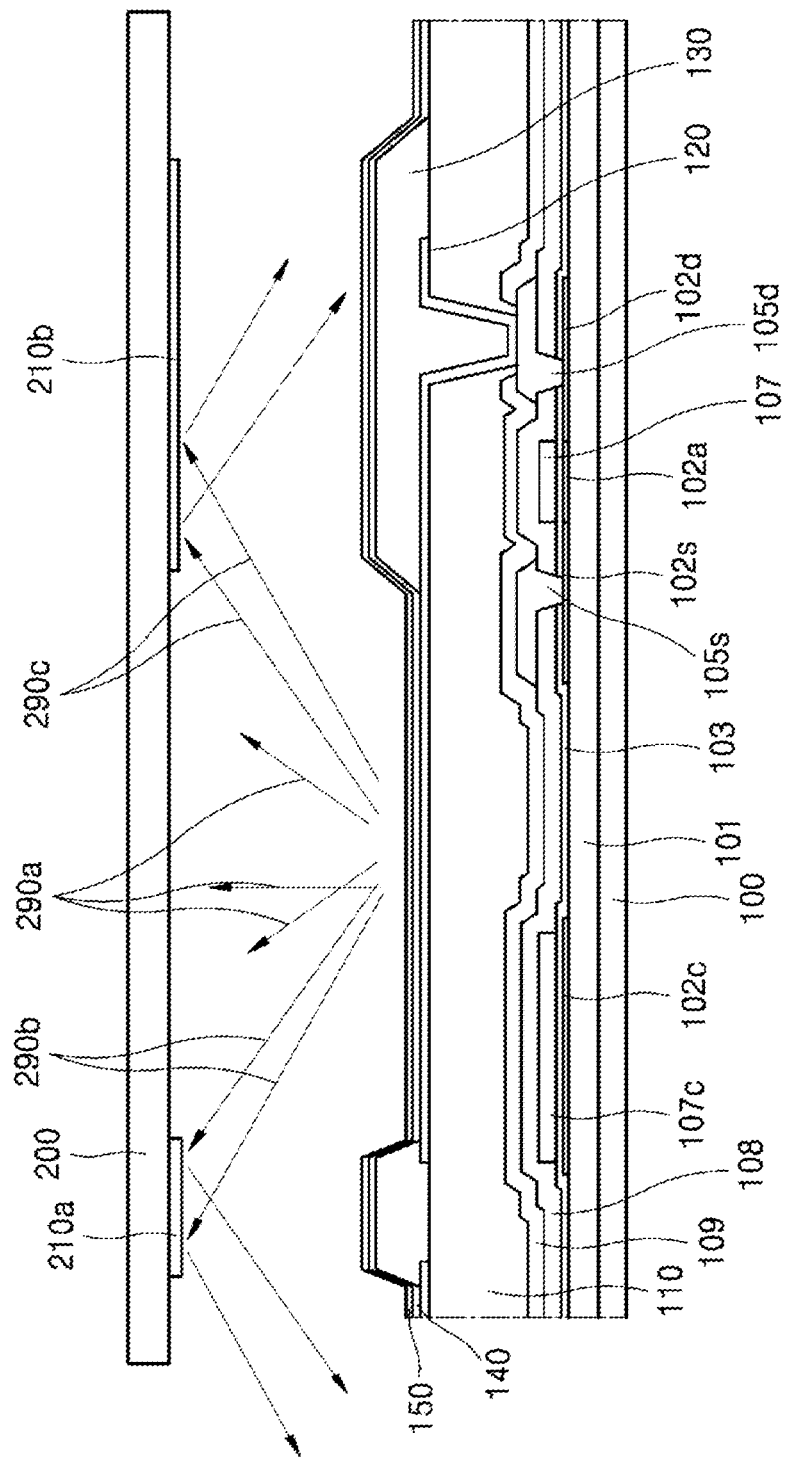
FIG. 2 is a cross-sectional view showing the configuration of an organic light emitting display panel with a mirror function.

FIG. 2 is a cross-sectional view illustrating a pixel of an organic light emitting display panel with a mirror function.

As shown in FIG. 2, the following are arranged on a first substrate 100: a buffer 101, an active layer 102a, conductive portions 102s and 102d positioned both sides of the active layer 102a, a gate 107, a gate insulating film 103 positioned between the gate 107 and the active layer 102a, a source 105s, a drain 105d, an interlayer dielectric 108, a protective layer 109, a planarization layer 110, a first electrode 120 for controlling emission for each pixel, a second electrode 150 disposed over a plurality of pixels, and a bank 130 defining an emission region. In addition, an organic light emitting layer 140 is interposed between the first electrode 120 and the second electrode 150 and may also be disposed on the bank 130. In addition, two storage capacitor layers 107c and 102c may be disposed on the gate insulating film 103.

The pixel structure of FIG. 2 is illustrative, and the pixel may have different structures, for example, a TFT structure, without being limited thereto.

As shown in FIG. 2, mirrors 210a and 210b for reflecting external light are arranged on a second substrate 200. Due to a distance between the mirrors 210a and 210b and the organic light emitting layer 140 of the first substrate 100, some of the light (290a) emitted from the organic light emitting layer 140 travels upward, whereas some of the light (290b and 290c) is totally reflected toward an edge, which may reduce the luminance efficiency.

Figure 3:
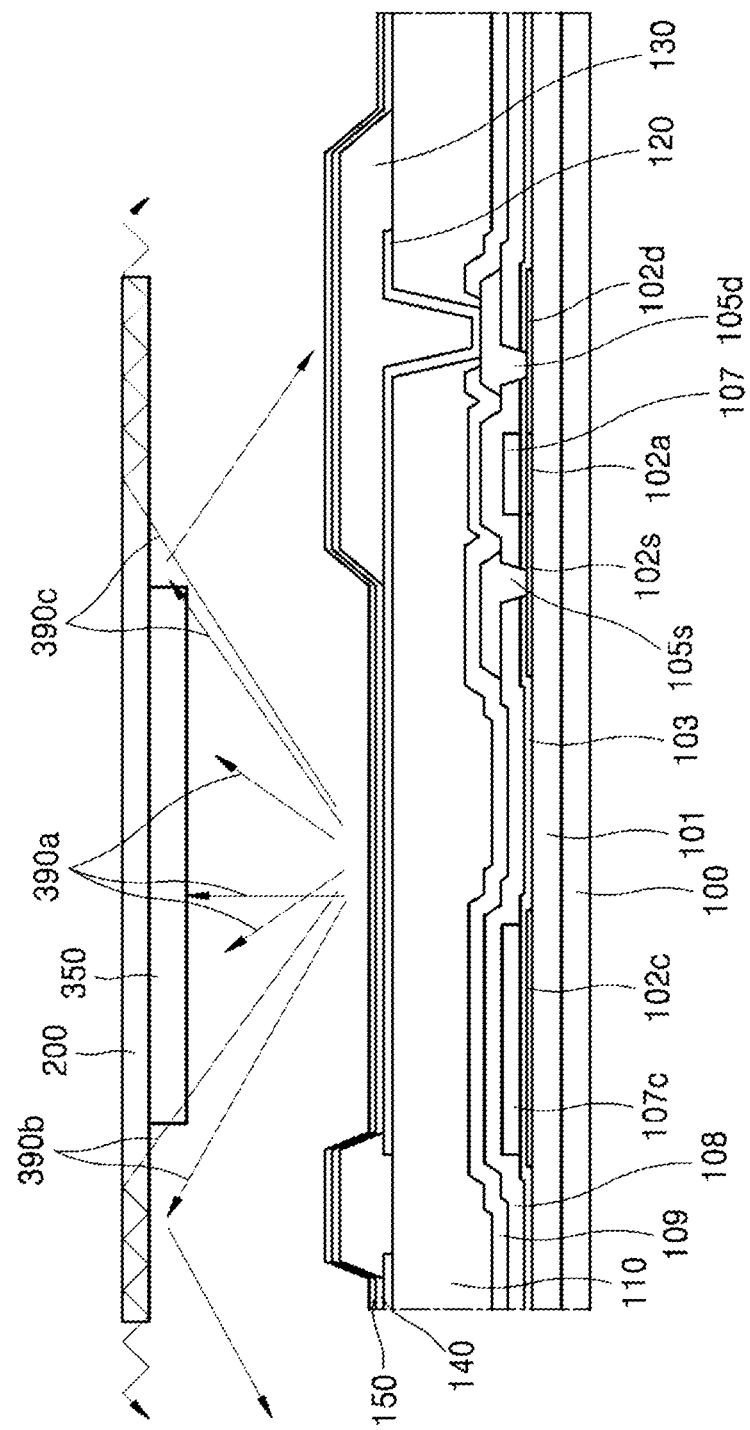
FIG. 3 is a cross-sectional view showing the configuration of an organic light emitting display panel with a transmission function.

FIG. 3 is a cross-sectional view illustrating a pixel of an organic light emitting display panel with a transmission function. The first substrate 100, the thin film transistors, the data lines and the gate lines and so on, which are formed, or located, on the first substrate 100, have the same configurations as described above and, therefore, explanation of the same is not repeated herewith for brevity.

As shown in FIG. 3, a color filter 350 is arranged on a second substrate 200. Due to a distance between the second substrate 200 and an organic light emitting layer 140 of a first substrate 100, some of the light (390a) emitted from the organic light emitting layer 140 travels upward, whereas some of the light (390b and 390c) is totally reflected toward an edge, which may reduce the luminance efficiency.

As described with reference to FIGS. 2 and 3, a display panel with the mirror function or the transmission function has reduced luminance efficiency because a portion of the light is totally reflected toward the edge of the device due to a top plate bonding structure. Therefore, a structure allowing light to be output externally in a display panel having the transmission function or the mirror function is needed.

Hereinafter, a display panel and a display device capable of improving luminance efficiency by using a low refractive reversed taper structure will be described. In an exemplary embodiment, the display panel includes a first substrate having a pixel region and an emission region which are defined by a plurality of gate lines and a plurality of data lines, and a second substrate on which a plurality of partitions are disposed. The each of the partitions of the second substrate in the display panel has a reverse taper structure. When implementing a display device having a mirror function, the display panel includes a plurality of partitions arranged on a substrate on which a reflector is present.

The display panel may be an organic light emitting display panel or a liquid crystal display panel, but the present disclosure is not limited thereto and may be applied to different display devices and display panels having a transmission or mirror function. The common structure of the display panel of the present disclosure is a structure including a first substrate or lower substrate formed, or located, thereon with thin film transistors for controlling pixels and gate lines and data lines connected to the thin film transistors, and an opposing second substrate or upper substrate on which a plurality of partitions are arranged. In particular, the exemplary embodiments of the present disclosure can be applied to a display device having a mirror function or a transmittance function, and can improve the luminance efficiency of such display devices.

Hereinafter, a low refractive index reversed taper structure formed, or located, on the second substrate or upper substrate will be referred to as a partition. The partition is disposed to correspond to an emission region or pixel region of the first substrate (lower substrate). The partition may be formed from a negative photoresist. When the negative photoresist is deposited (coated) on the second (upper) substrate and developed a reverse taper structure may be formed, and a range of luminance viewing angles may be controlled based on the angle of taper. Of course, the present disclosure is not limited to the negative photoresist but may employ different materials as long as they can be used to form a reverse tapered partition of the display device or display panel of the present disclosure.

In addition, the display panel of the present disclosure is not limited to the reverse taper structure, and may also include a partition with a low refractive index material and all partition structures in which light emitted from an emission region, which is controlled by TFTs formed in a pixel region, is reflected toward the upper substrate (the second substrate) by the partition.

Hereinafter, a second substrate of the display panel 11 shown in FIG. 1 will be described in further detail. More specifically, the second substrate is bonded to a first substrate to form the display panel 11. The first substrate has a plurality of gate lines to which a gate signal is applied, a plurality of data lines to which a data signal is applied, a plurality of pixels defined at intersections of the data lines and the data lines, a bank defining a pixel emission region formed, or located thereon, and the second substrate has a partition positioned on the second substrate such that it corresponds to the bank region.

Figure 4:
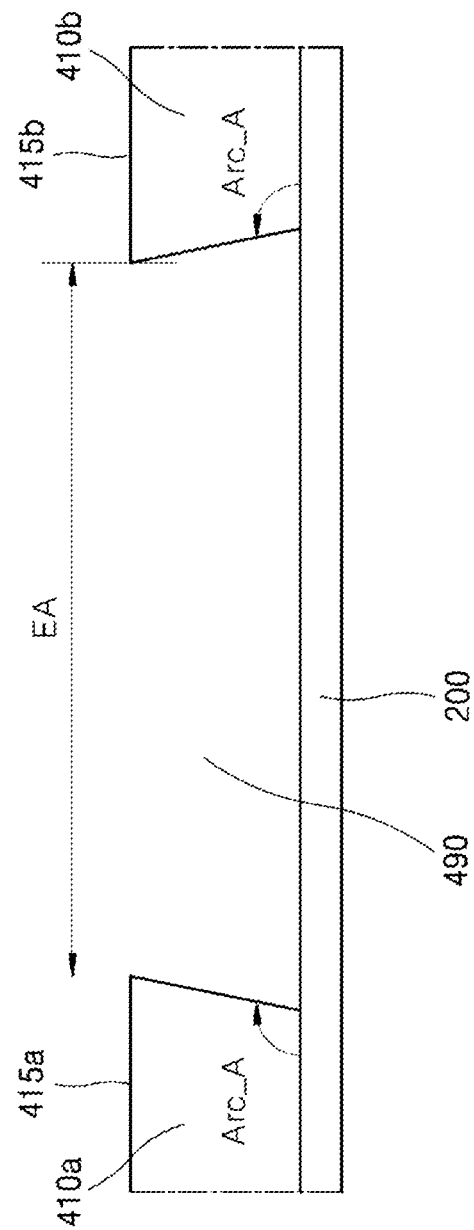
FIG. 4 is a cross-sectional view of a second substrate on which partitions having a reverse taper structure are formed.

FIG. 4 is a cross-sectional view of a substrate on which partitions are formed, or located, according to one embodiment of the present disclosure. Each of these partitions formed, or located, on the second substrate (i.e., an upper substrate) has a reverse taper structure. A reverse taper structure may be considered to be any structure with an associated width that increases as the distance from the second substrate is increased. For example, as shown in FIG. 4, partitions 410a and 410b are formed, or located, on an upper substrate, i.e., the second substrate 200. An emitting area (EA) between the partitions 410a and 410b are corresponds to an emission area in a pixel region. The emission area may be considered to be the area from which light is emitted based on the pixels thereof. The material of the partitions 410a and 410b has a lower refractive index than a material formed, or located, in a region 490 where light is emitted and transmitted. As a result, partitions 410a and 410b cause the light generated due to the emission of the organic layer to travel to the second substrate (i.e., the upper substrate 200) without being totally reflected toward an edge.

If the material formed, or located, in the region 490 is an adhesive material for bonding the upper substrate and the lower substrate, the partitions 410a and 410b can be deposited and formed by using a material having a smaller refractive index than the adhesive material. Accordingly, since the refractive index of the partitions 410a and 410b is smaller than a material (for example, air, vacuum, and the like) of the emission area, the partitions 410a and 410b can reflect the light such that the light travels toward the second substrate, which may improve luminance efficiency.

In particular, it is possible to control the luminance efficiency by selecting an adhesive material having a larger refractive index than the partitions and which bonds the first substrate to the second substrate in the emission area.

An angle Arc_A formed between a section of the substrate in contact with partitions 410a and 410b (substrate side section), respectively, and a side wall of the partitions 410a and 410b may be equal to or greater than 90 degrees. In this case, light propagating at a low angle may also be output to the outside. The partitions tapered reversely with respect to the second substrate can prevent light between banks from being laterally totally reflected, which can result in increasing the output (luminance) efficiency of the organic layer.

A section facing a bank portion of the first substrate (i.e., the lower substrate) in the partitions 410a and 410b is referred to as a bank side section. In FIG. 4, reference numeral 415a denotes a bank side section of the partition 410a and reference numeral 415b denotes a bank side section of the partition 410b. The bank side sections 415a and 415b may or not contact a bank of the lower substrate. In addition, an adhesive material may be coated on the bank side sections 415a and 415b to maintain a state of adhesion between the upper substrate and the lower substrate.

Figure 5:
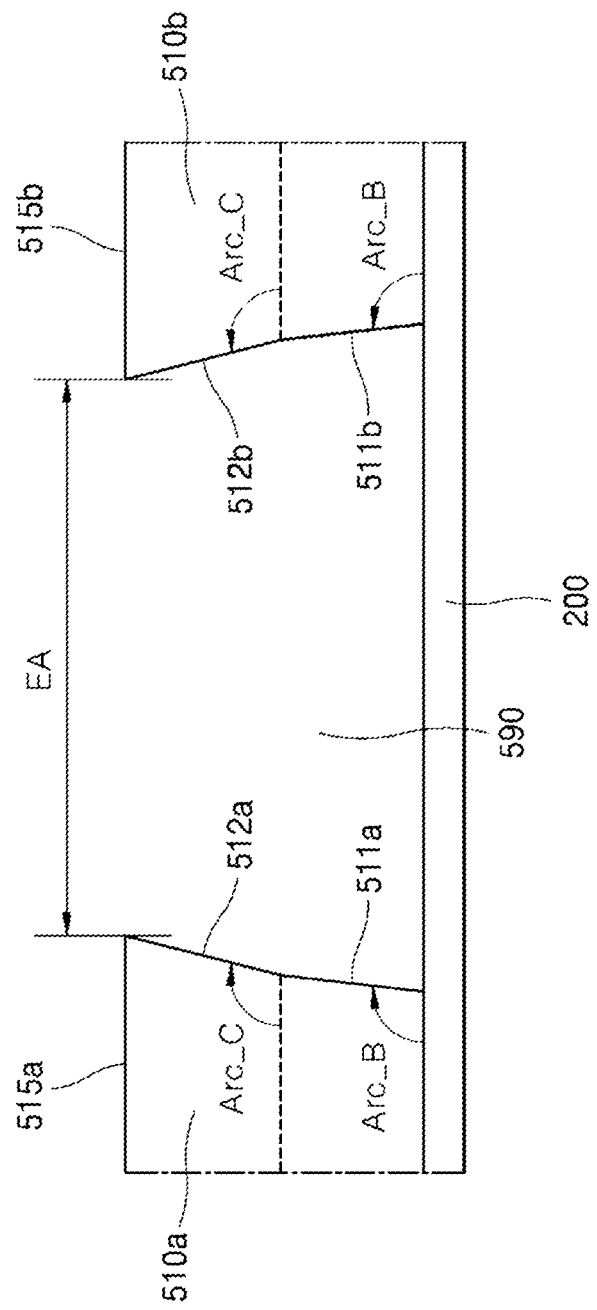
FIG. 5 is a cross-sectional view of a second substrate on which partitions having a multi-step reverse taper structure are formed.

FIG. 5 is a sectional view of a substrate on which partitions are formed, or located, according to another embodiment of the present invention, in which a lateral side of each partition has a concave polygonal surface.

As shown in FIG. 5, the side wall of each of partitions 510a and 510b formed, or located, on the second substrate 200 is not flat. Referring to the partition 510a, the partition 510a has a concave polygonal surface combining two faces 511a and 512a. Similarly, the other partition 510b has a concave polygonal surface combining two faces 511b and 512b.

An angle Arc_B formed between the face 511a and the substrate side section of the partition 510a may be made to be smaller than an angle Arc_C formed between the face 512a and a face parallel to the substrate side section 510a of the partition to increase light output efficiency.

After depositing a material (for example, a negative photoresist) used to form the structure illustrated in FIG. 5 when the material is exposed or etched using a halftone mask, and the partitions can have a two-step reversed taper structure, as illustrated in FIG. 5, by adjusting the exposure time and/or exposure amount.

Although FIG. 5 shows the section of the second substrate on which partitions having the two-step reversed taper structure are formed, or located, the present disclosure is not limited thereto. For example, the partitions may have a three or more-step reverse taper structure, which falls within the scope of the invention defined in the claims.

In FIG. 5, bank side sections 515a and 515b may or may not contact a bank of the lower substrate. In addition, an adhesive material may be coated on the bank side sections 515a and 515b to maintain a state of adhesion between the upper substrate and the lower substrate.

If a material formed, or located, in a region 590 where light is emitted and transmitted is an adhesive material for bonding the upper substrate and the lower substrate together, the partitions 510a and 510b can be deposited and formed by using a material having a smaller refractive index than the adhesive material. On the other hand, in the absence of adhesive material, it is possible to form the partitions by using a material having a lower refractive index than a material (for example, air, vacuum, and the like) of the region 590 through which light may be transmitted.

Figure 6:
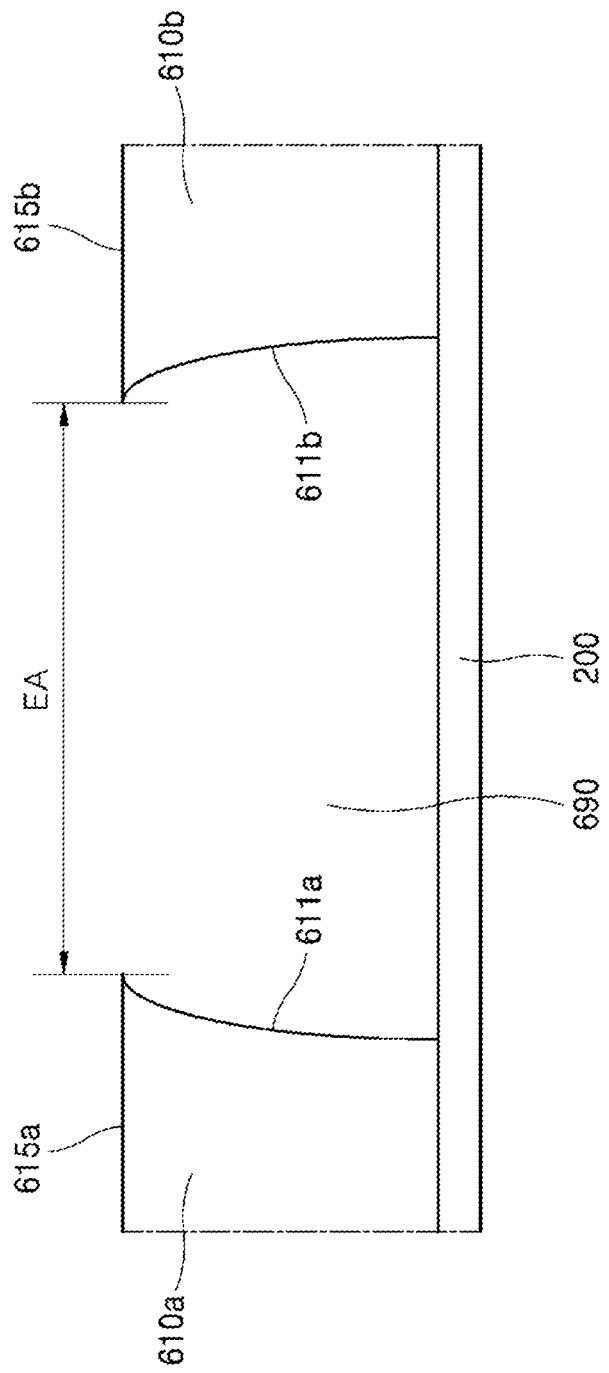
FIG. 6 is a cross-sectional view of a second substrate on which partitions having a concave groove structure are formed.

FIG. 6 is a sectional view of a substrate on which partitions are formed, or located, according to still another embodiment of the present invention, in which a side wall of each partition has a concave arc-shaped surface.

As shown in FIG. 6, the side wall of each of partitions 610a and 610b formed, or located, on the second substrate 200 is not flat. The partition 610a has a concave arc-shaped surface 611a. Similarly, the partition 610b has a concave arc-shaped surface 611b.

After depositing a material (for example, a negative photoresist) used to form the partitions to provide the structure as shown in FIG. 6 on the second substrate (i.e., the upper substrate 200), when the material is exposed or etched using a halftone mask, the partitions can have a concave reversed taper structure by gradually increasing the exposure time or exposure amount. Although FIG. 6 shows the section of the second substrate on which the partitions having the concave reversed taper structure are formed, or located, the present disclosure is not limited thereto. For example, the partitions may have a combination of the structure of FIG. 5 and the structure of FIG. 6, which falls within the scope of the invention defined in the claims. For example, the partitions may have a reversed taper structure including a linear face and an arc-shape face.

In FIG. 6, bank side sections 615a and 615b may or not contact a bank of the lower substrate. In addition, an adhesive material may be coated on the bank side sections 615a and 615b to maintain a state of adhesion between the upper substrate and the lower substrate.

If a material formed, or located, in a region 690 where light is emitted and transmitted is an adhesive material for bonding the upper substrate and the lower substrate together, the partitions 610a and 610b can be deposited and formed by using a material having a smaller refractive index than the adhesive material. On the other hand, in the absence of an adhesive material, it is possible to form the partitions by using a material having a lower refractive index than a material (for example, air, vacuum, or the like) of the region 690 through which light may be transmitted.

As described above with reference to FIGS. 4 to 6, when the partitions are formed, or located, the light emitted from the emission area can travel toward the upper substrate 200, which can result in improvement of the luminance efficiency. The partitions shown in FIGS. 4 to 6 can have a smaller refractive index than the material formed, or located, in the regions 490, 590 and 690, respectively, where the light is emitted and transmitted. In one embodiment, a low refractive index organic film may be used to form the partitions. In one embodiment, the organic film may have a refractive index smaller than 1.53 (i.e., n<1.53).

Although not shown, a separate reflective material may be formed, or located, on a side wall of each of the partitions shown in FIGS. 4 to 6, thereby further improving the light output efficiency. In particular, in a case of a mirror display panel, since partitions are formed, or located, on an extension surface of a mirror, it is possible to improve the output efficiency of light emitted from an organic layer without impairing visibility.

Figure 7:
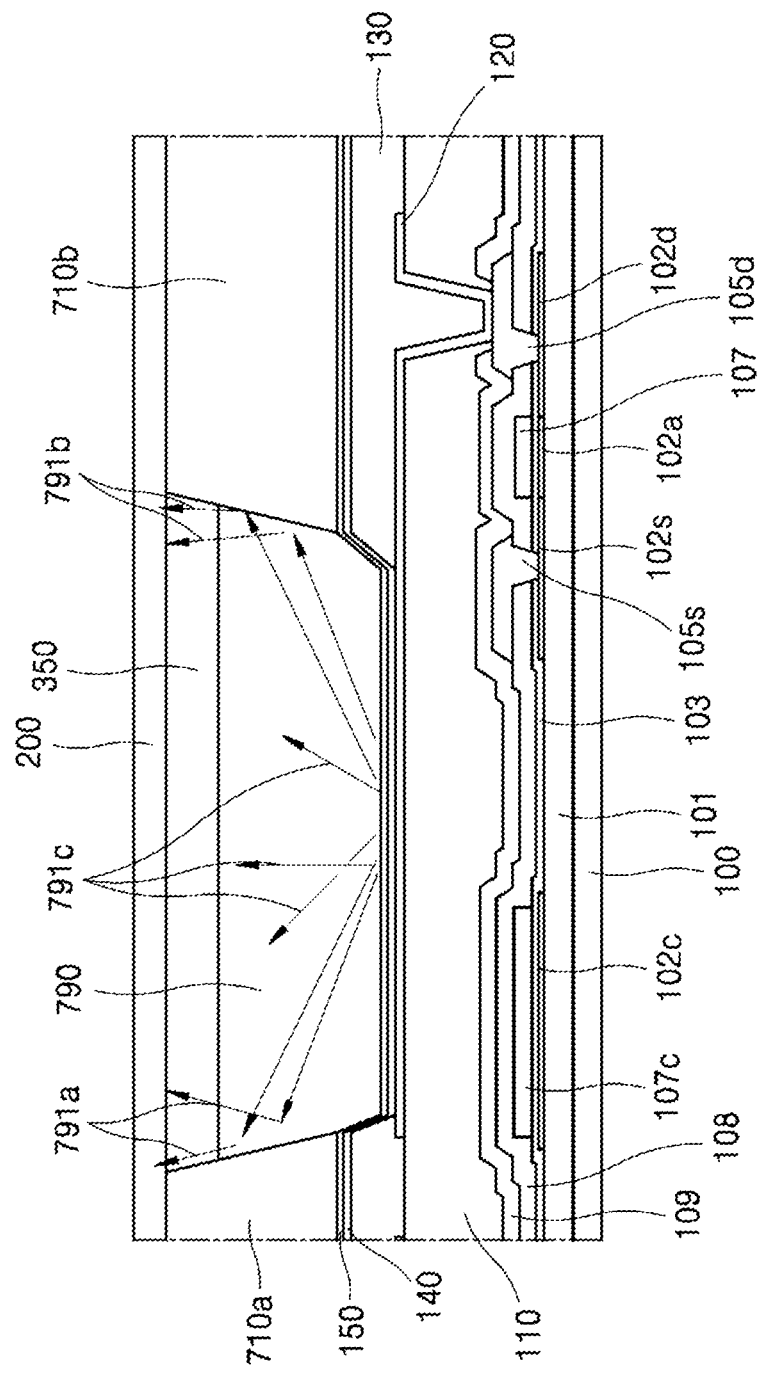
FIG. 7 is a cross-sectional view of a display panel with partitions having a multi-step reverse taper structure.

FIG. 7 is a view showing the configuration of a display panel according to one embodiment of the present disclosure. The first substrate 100, the thin film transistors, the data lines and the gate lines and so on, which are formed, or located, on the first substrate 100, have the same configurations as described above and, therefore, explanation of the same is not repeated herewith for brevity.

Partitions 710a and 710b are formed, or located, in a region corresponding to the bank 130. An adhesive material such as a resin may be formed, or located, in a region 790. A refractive index of the partitions 710a and 710b may be smaller than that of the adhesive material in the region 790.

In the configuration of FIG. 7, some of the light (791c) emitted from the organic light emitting layer 140 travels toward the second substrate 200. On the other hand, some of the light (791a and 791b) travelling toward the partitions 710a and 710b is reflected toward the second substrate 200 due to the smaller refractive index of the partitions 710a and 710b.

The display panel of FIG. 7 may be a transparent display panel when the gate lines, the data lines, the thin film transistors, the first electrode, the second electrode and so on formed, or located, on the lower substrate are made of a transparent material. In this case, the color filter 350 can be used to decrease reflection of wirings and haze and the inversed tapered partitions 710a and 710b formed, or located, in the vicinity of the emission can be used to increase the light output efficiency. In one embodiment, the color filter 350 is interposed between the partitions 710a and 710b corresponding to the emission area and is set to be lower than or flush with the partitions 710a and 710b.

To summarize, in one embodiment of FIG. 7, the transparent display panel includes gate lines and data lines made of a transparent conductive material, and can be fabricated by selecting a material for the partitions such that the light transmittance of the partitions corresponding to the bank region is equal to or greater than the light transmittance of the first substrate. In such a case, since external light can pass through the partitions, it is possible to fabricate a transparent display panel. In addition, it is possible to increase the luminance efficiency by outputting light emitted from the emission area toward the second substrate because of the refractive index of the partitions.

Figure 8:
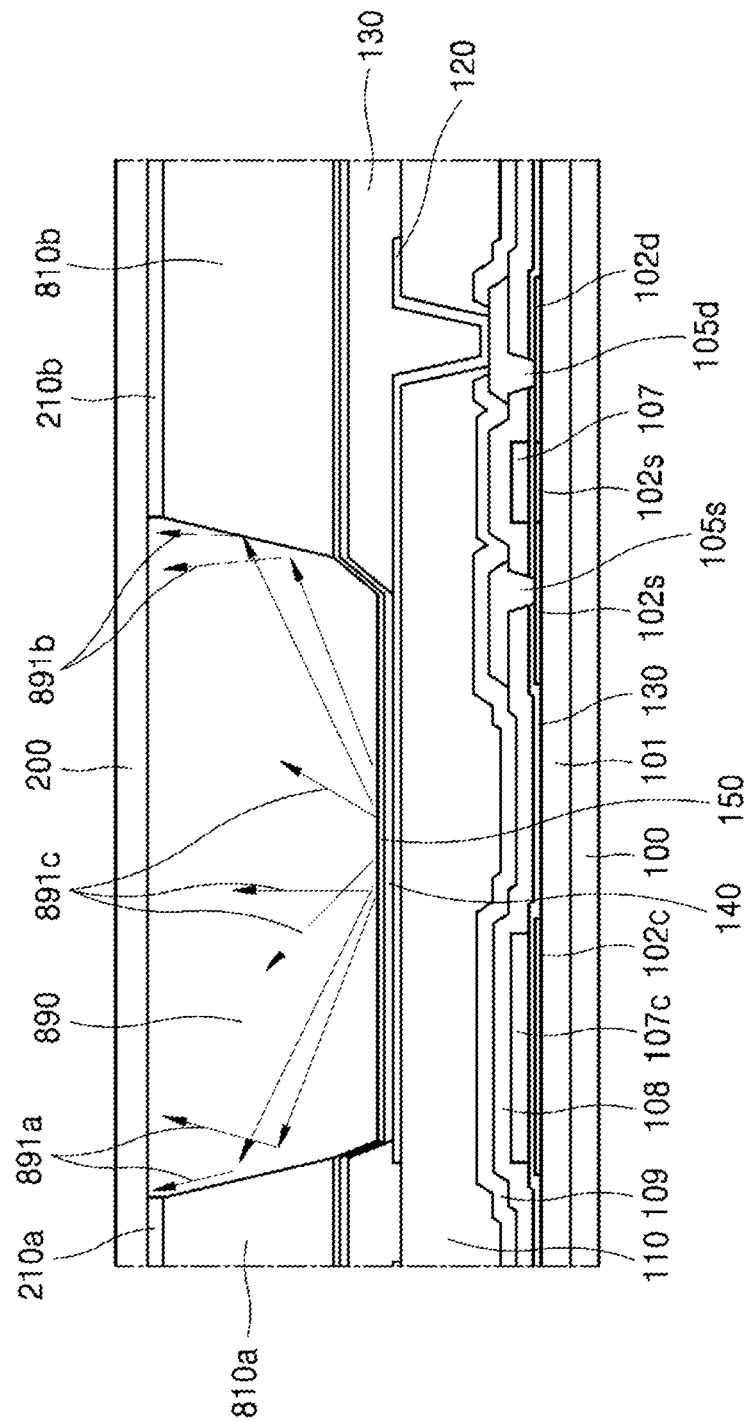
FIG. 8 is a cross-sectional view of a display panel having a mirror function, and including partitions having a multi-step reverse taper structure.

FIG. 8 is a view showing the configuration of a display panel having a mirror function according to another embodiment of the present disclosure. The first substrate 100, the thin film transistors, the data lines and the gate lines and so on, which are formed, or located, on the first substrate 100, have the same configurations as described above and, therefore, the same are not repeated herewith for brevity.

Partitions 810a and 810b are formed, or located, in a region corresponding to the bank 130. As shown in FIG. 8, the partitions 810a and 810b may be formed, or located, on mirrors 210a and 210b, respectively. An adhesive material, such as a resin, may be formed, or located, in a region 890. A refractive index of the partitions 810a and 810b may be smaller than that of the adhesive material in the region 890.

In the configuration illustrated in FIG. 8, some of the light (891c) emitted from the organic light emitting layer 140 travels toward the second substrate 200. On the other hand, some of the light (891a and 891b) travelling toward the partitions 810a and 810b is reflected toward the second substrate 200 due to the smaller refractive index of the partitions 810a and 810b.

As shown in FIG. 8, in order to fabricate the display panel having a mirror function, the reverse tapered partitions 810a and 810b can be formed by sputtering, exposing and etching metal having a high reflectivity to pattern the mirrors 210a and 210b in compliance with the emission area 890, and then coating a high refractive index organic film thereon. As described above, a negative photoresist may also be used without being limited thereto.

Although not shown, a separate reflective material may be formed, or located, on a side wall of each of the partitions 810a and 810b shown in FIG. 8, thereby further improving the light output efficiency. In particular, in a display panel having a mirror function, because the partitions are formed, or located, on extension surfaces of mirrors, it is possible to improve the output efficiency of light emitted from the organic layer without impairing visibility.

The partitions shown in FIGS. 7 and 8 are examples of the partitions shown in FIG. 4. However, the present invention is not limited thereto. For example, partitions having a concave polygonal surfaces or a concave arc-shaped surface, as illustrated in FIGS. 5 and 6, may be applied to the structures illustrated in FIGS. 7 and 8. Further, the color filter 350 illustrated in FIG. 7 may also be included in the structure illustrated in FIG. 8. In this embodiment, the color filter 350 shown in FIG. 7 is interposed between the partitions 810a and 810b and is lower than or flush with the partitions 810a and 810b.

Figure 9:
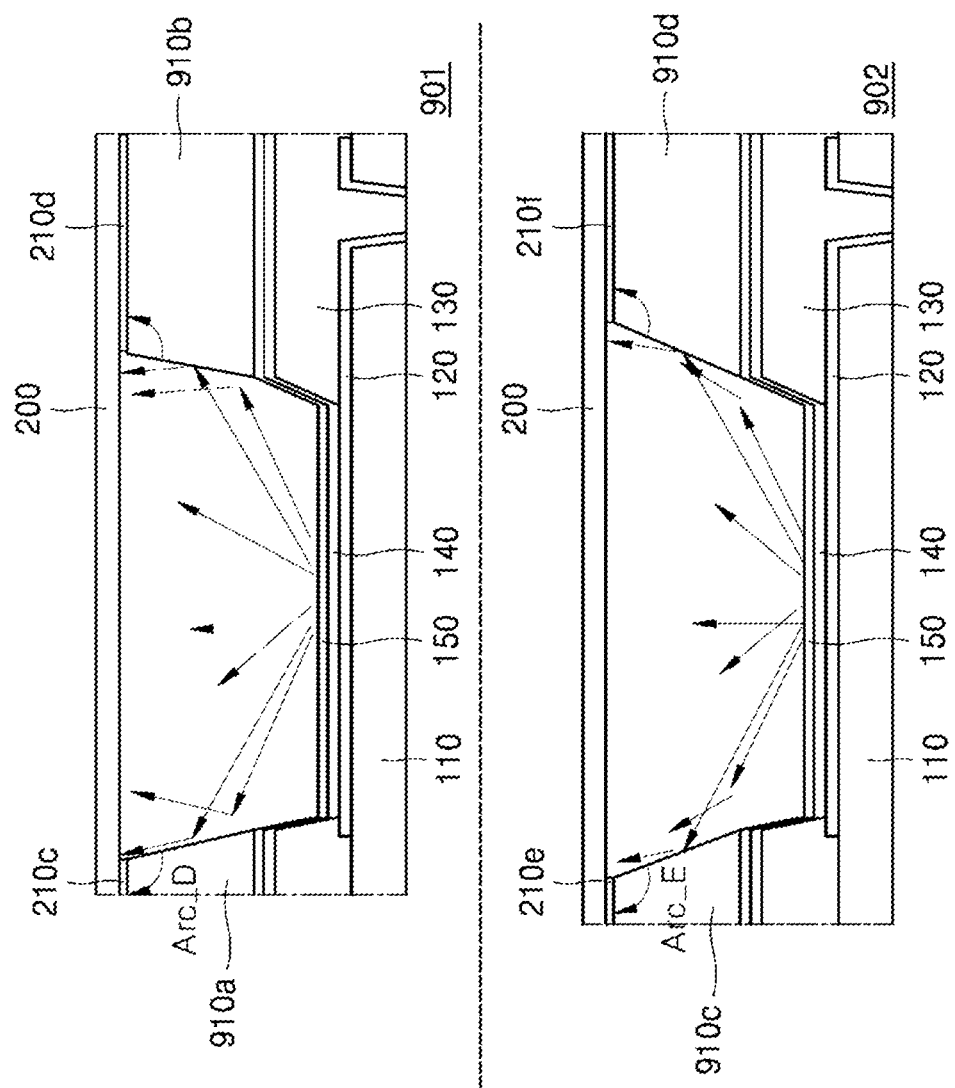
FIG. 9 are cross-sectional views of a display device according to exemplary embodiments of the present disclosure, in which the reverse taper angle of the partitions are varied, and the relation thereof to a viewing angle.

FIG. 9 is a schematic view showing a relationship between a reverse taper angle of partitions according to one embodiment of the present invention and a viewing angle. As shown in FIG. 9, a comparison can be made between a display panels 901 and 902, both having a mirror function, in terms of the total aperture ratio of a highly-reflective metal material constituting a mirror and a reverse taper angle of the partitions.

In the mirror display panel 901, metal mirrors 210c and 210d are formed and an angle formed between partitions 910a and 910b and the second substrate 200 or the mirrors 210c and 210d is denoted by Arc_D. In the mirror display panel 902, metal mirrors 210e and 210f are formed and an angle formed between partitions 910c and 910d and the second substrate 200 or the mirrors 210e and 210f is denoted by Arc_E.

Comparing display panels 901 and 902, the aperture ratio of the metal constituting the mirrors 210c and 210d of the display panel 901 is lower than the aperture ratio of the metal constituting the mirrors 210e and 210f of the display panel 902. In addition, the reverse taper angle Arc_D of the display panel 901 is smaller than the reverse taper angle Arc_E of the display panel 902. As a result, display panel 901 provides luminance efficiency for a narrow viewing angle and display panel 902 provides luminance efficiency for a wide viewing angle.

Therefore, depending on characteristics of a display device, the reverse taper angle of the partitions can be decreased for a narrow viewing angle, or increased for a wider viewing angle. To this end, the exposure time and exposure amount can be adjusted.

Figure 10A:
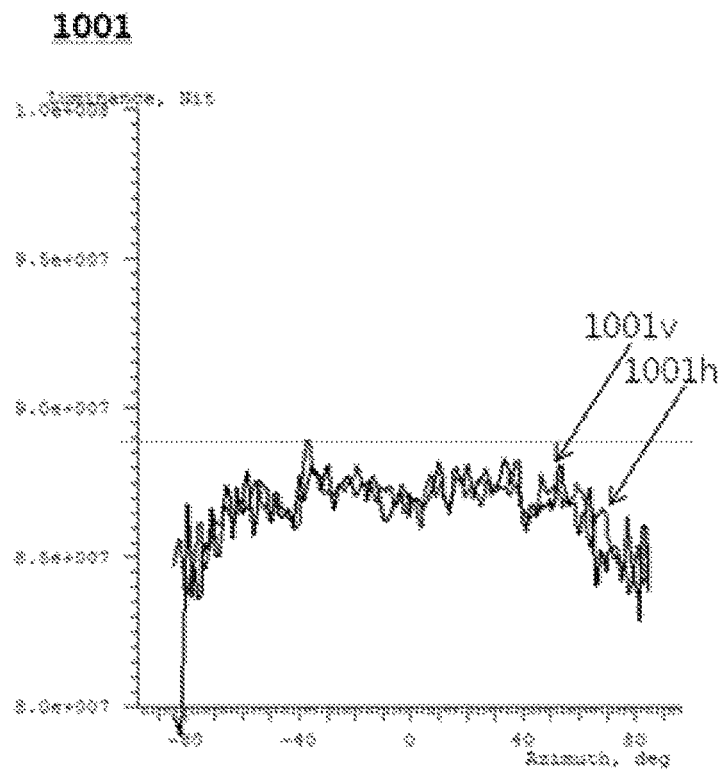
FIG. 10A are simulation results showing the luminance efficiency of a display device that does not include partitions according to exemplary embodiments of the present disclosure.
Figure 10B:
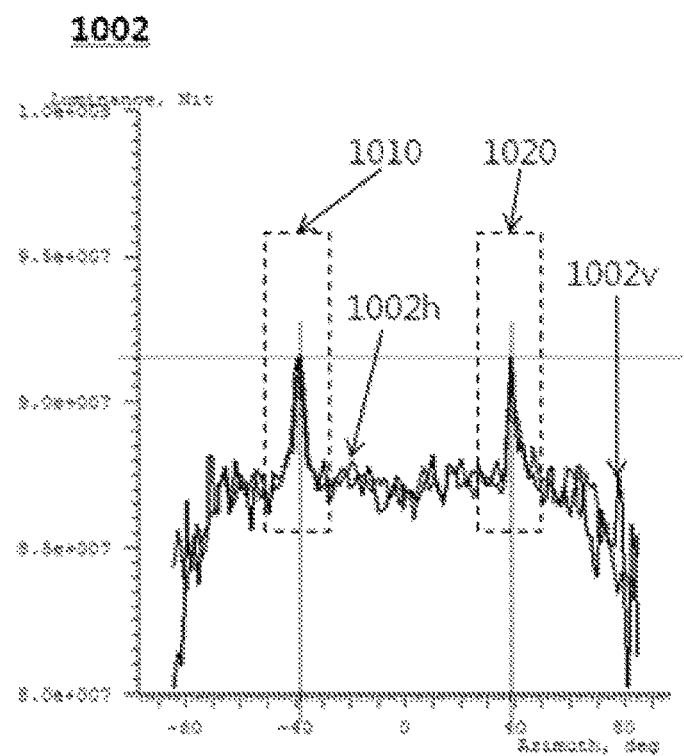
FIG. 10B are simulation results showing an improvement in the luminance efficiency, when a reverse tapered low refractive index organic film according to one embodiment of the present disclosure is used to form the partitions.

FIGS. 10A and 10B are simulation results showing the improvement in luminance efficiency when a reverse tapered low refractive index organic film according to one embodiment of the present disclosure is used to form the partitions.

Graph 1001 of FIG. 10A shows a change in vertical viewing angle 1001v and horizontal viewing angle 1001h in the display panel structure illustrated in FIG. 2, and graph 1002 of FIG. 10B shows a change in the vertical viewing angle 1002v and horizontal viewing angle 1002h in the display panel structure illustrated in FIG. 8. As seen from FIGS. 10A and 10B, the luminance is increased by about 4.8% near a one side viewing angle of 40 degrees (in a range from 37 degrees to 43 degrees) (see reference numerals 1010 and 1020) in graph 1002 compared to the corresponding values in graph 1001.

Further, as described earlier, when different reverse taper angles are employed as illustrated in FIG. 5, the luminance efficiency increases. This phenomenon is described below in more detail.

Figure 11:
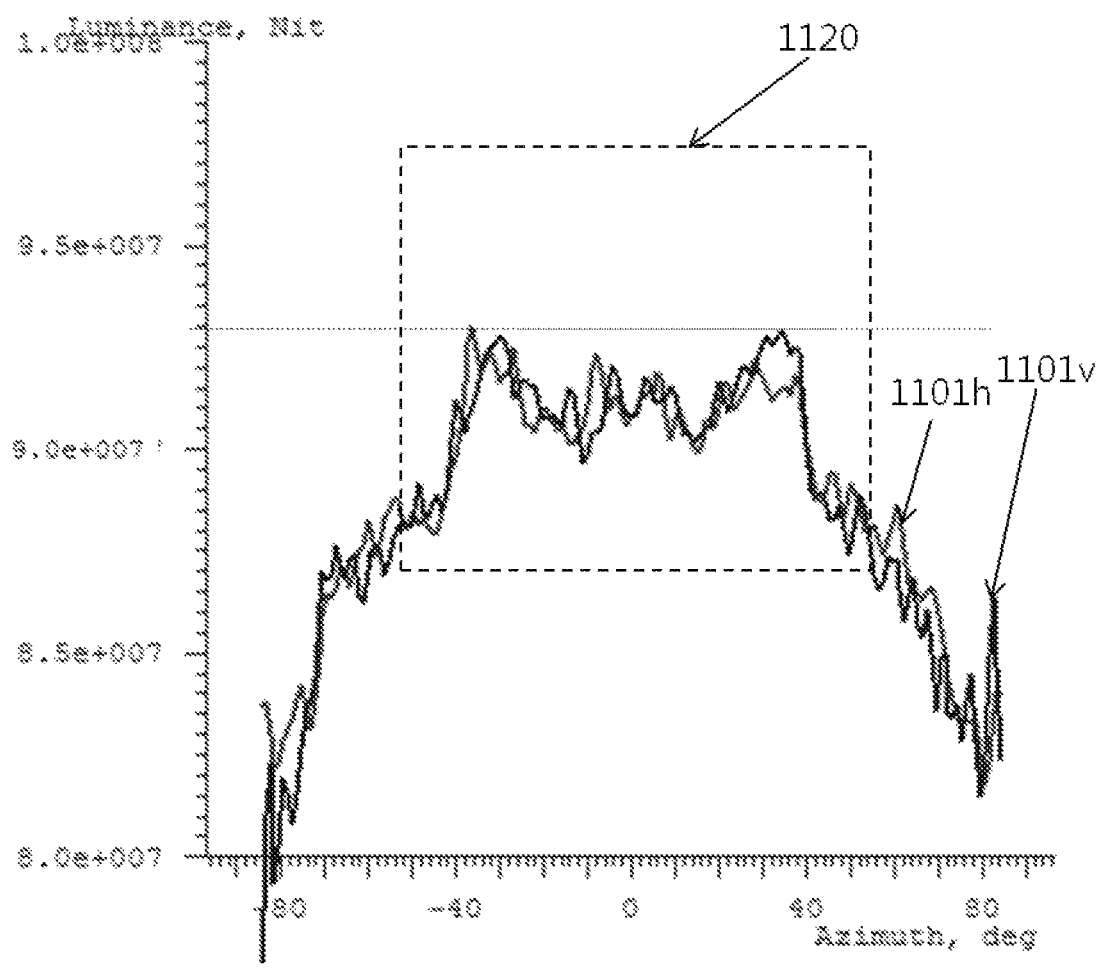
FIG. 11 are simulation results showing an improvement in the luminance efficiency when a two-step reverse tapered low refractive index organic film according to another embodiment of the present invention is used to form the partitions.

FIG. 11 is a simulation result showing the improvement in luminance efficiency when a two-step reverse tapered low refractive index organic film according to another embodiment of the present invention is used to form the partitions. As an example, simulation results for a display device having a mirror function, and including partitions, as illustrated in FIG. 4, will be described below. When the simulation results shown in FIG. 11 are compared to graphs 1001 and 1002 of FIGS. 10A and 10B, it can be seen that both the vertical viewing angle 1101v and the horizontal viewing angle 1101h of graph 1102 of FIG. 11 increase (see reference numeral 1120) compared to the corresponding angles shown in FIGS. 10A and 10B.

As described above with reference to FIGS. 10 and 11, when partitions are formed in a multi-step shape or a concave arc shape, the luminance efficiency is increased. In addition, it is possible to control a luminance viewing angle by adjusting a reverse taper angle of the partitions.

Figure 12:
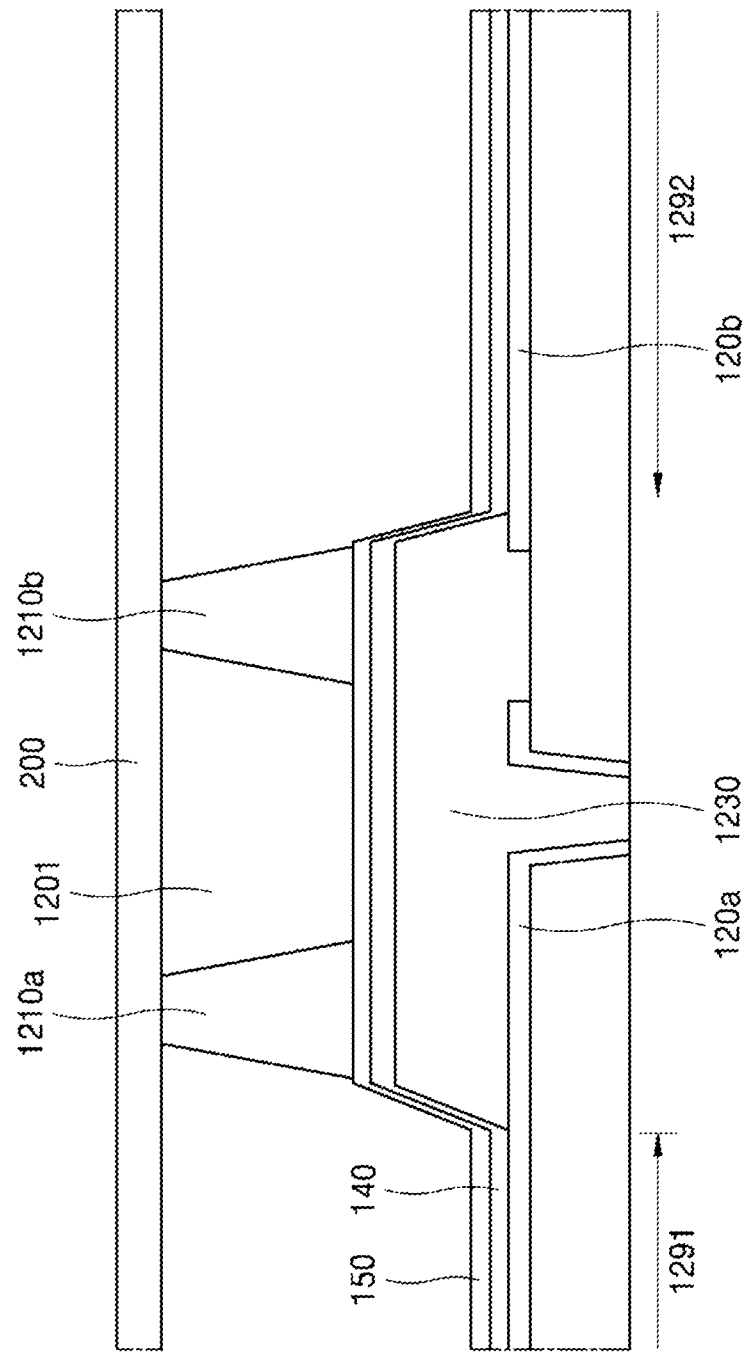
FIG. 12 is a cross-sectional view showing the configuration of partitions according to another embodiment of the present invention, where the partitions are formed along an edge of a bank.

FIG. 12 is a schematic view of partitions according to another embodiment of the present disclosure. The partitions are formed, or located, on the second substrate corresponding to a bank region but may not necessarily be formed, or located, in the entire bank region.

As shown in FIG. 12, a bank 1230 is formed, or located, between two emission areas 1291 and 1292, which define pixel regions. The partitions 1210a and 1210b facing the bank 1230 may be formed, or located, on the second substrate 200 in alignment with the boundaries of the bank

1230. In this case, in a space 1201 between the partitions 1210a and 1210b, a separate material may not be formed, or located, or an adhesive material for bonding may be formed, or located. This arrangement can help to increase the luminance efficiency of light emitted from the emission areas as well as the adhesion of the display panel to the substrate.

A method of fabricating the display panel as described above includes a step of forming a bank defining an emission area on a first substrate, and a step of forming partitions in a region of a second substrate correspond to the entirety of the bank or at the boundaries of the bank. This method further includes a step of forming the partitions having a reverse taper structure. In addition, this method further includes a step of coating and exposing a negative photoresist in order to form the reverse tapered partitions on the second substrate in the display panel.

Figure 13:
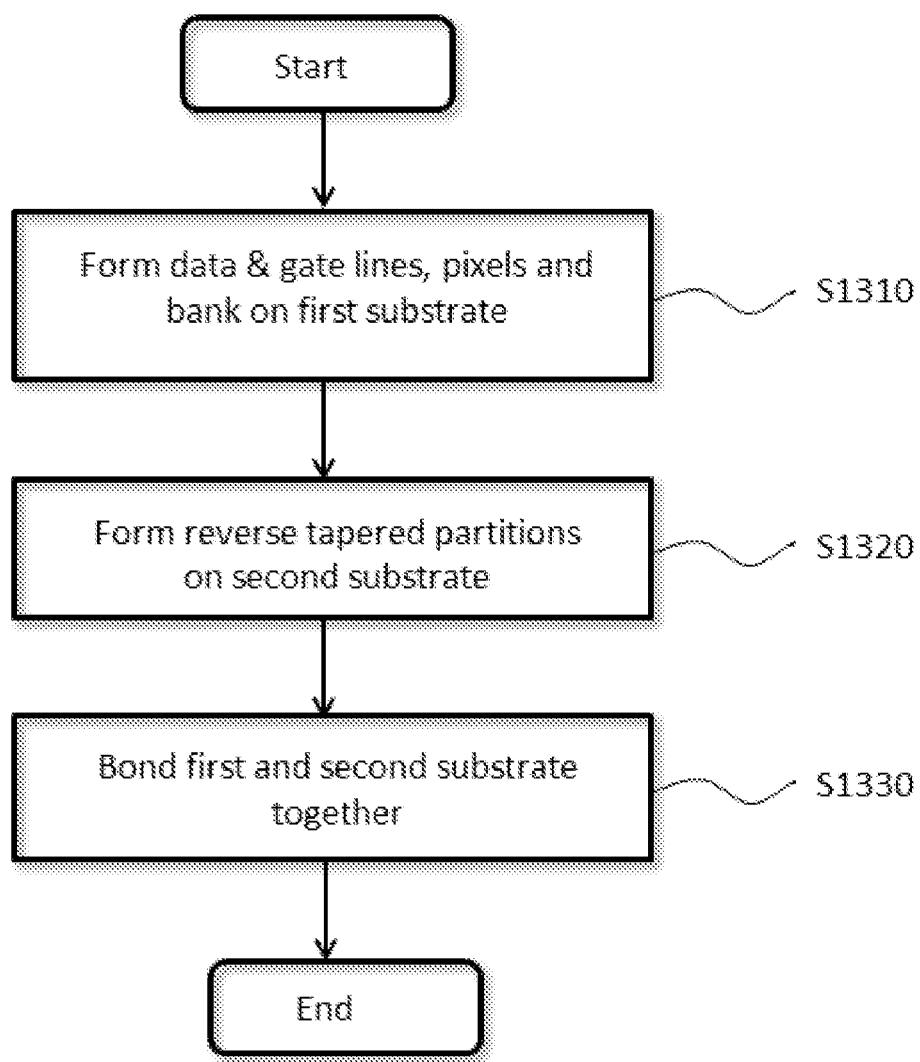
FIG. 13 is a schematic explanation of a process of fabricating a display panel according to one embodiment of the present invention.

FIG. 13 is a schematic illustration of the process of fabricating a display panel according to one embodiment of the present disclosure. Referring to FIG. 13, first, on a first substrate a plurality of gate lines and data lines are formed, a plurality of pixels are defined at intersections of the gate lines and data lines, and a bank region defining an emission area is formed (S1310). Next, reverse tapered partitions are formed on a second substrate to be bonded with the first substrate (S1320). At this time, the partitions corresponding to the bank region may be formed to correspond to the entire bank region, as described above with reference to FIGS. 3 to 8, or may be formed to correspond to an edge of the bank region, as described above with reference to FIG. 12. Then, the two substrates (the first and second substrates) are bonded together (S1330).

In forming the partitions on the second substrate, in a case of a display device having a mirror function, after highly-reflective metal for a mirror is formed, or located, on the second substrate, a low refractive index reverse taper structure may be formed. The low refractive index reverse taper structure is one example of the partitions included in such a structure.

When color filters are formed, or located, on the second substrate, a low refractive reverse taper structure can be formed after color filters corresponding to RGB and a black matrix are formed, or located. The low refractive index reverse taper structure is one example of the partitions included in such a structure.

In the process shown in FIG. 13, the refractive index of the partitions is lower than the refractive index of a material interposed between the emission area and the second substrate. To this end, a low refractive index organic film may be used to form the partitions.

In the bonding step S1330, the two substrates can be bonded together by including an adhesive material in a region in the second substrate where no partition is formed, or located. In in the exemplary embodiments of the present disclosure illustrated in FIGS. 3 to 8, an adhesive material may be formed, or located, in the emission area. In this case, the refractive index of the partitions is set to be lower than the refractive index of the adhesive material. On the other hand, in the exemplary embodiment of FIG. 12, if the partitions are formed, or located, at an edge of the bank and an adhesive material is formed, or located, corresponding to the vacant central portion of the bank, the refractive indexes of the partitions and the adhesive material may be independent of each other.

Figure 14:
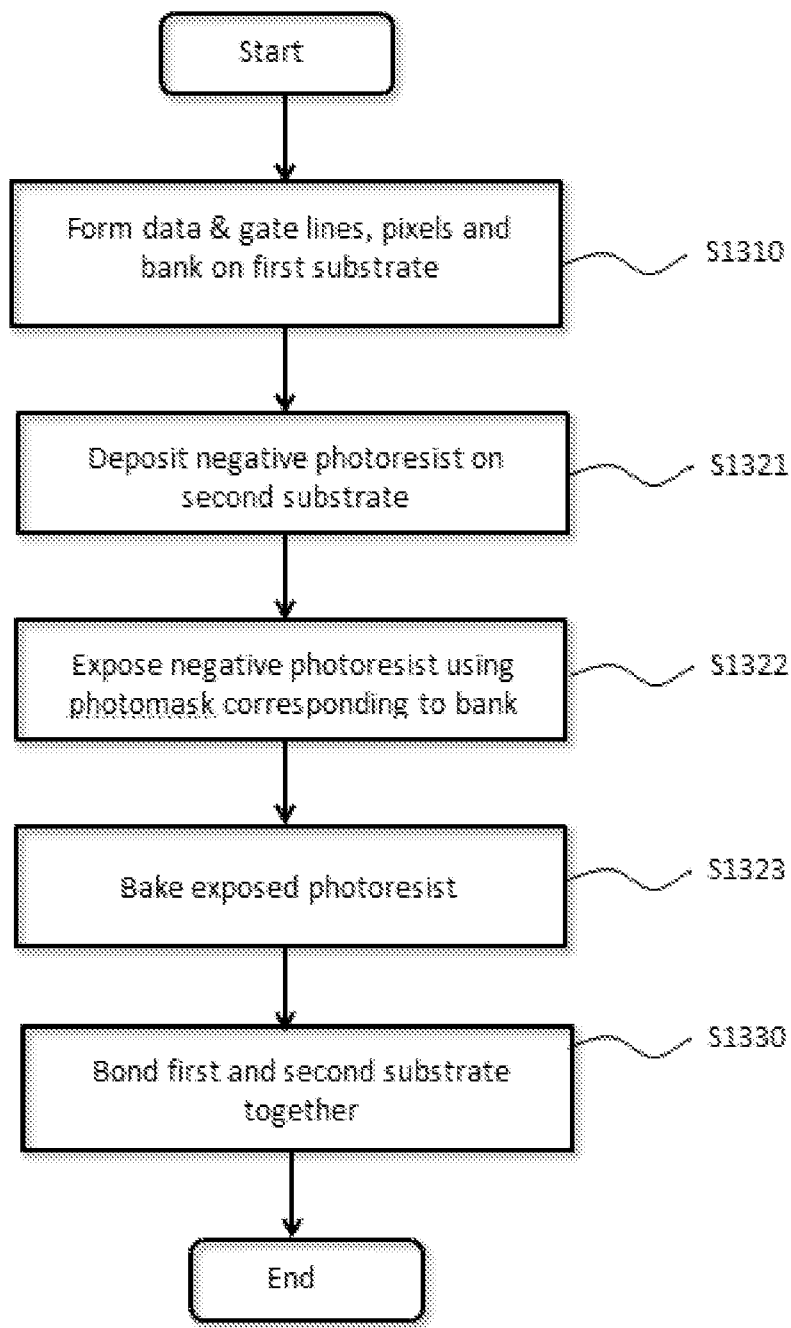
FIG. 14 is a detailed explanation of the process illustrated in FIG. 13.

FIG. 14 is a schematic explanation of the partition forming process according to one embodiment of the present invention. Particularly, in FIG. 14, step S1320 of FIG. 13 is described in greater detail. As illustrated in FIG. 14, a negative photoresist is deposited on the second substrate (S1321) and a photomask corresponding to the bank region of the first substrate is used to expose the negative photoresist, thereby forming the partitions (S1322). As the negative photoresist is cured upon exposure to light, the partitions can have the reverse tapered side wall shown in FIGS. 4, 5 and 6. In addition, a baking process of curing the exposed negative photoresist may be selectively performed to maintain the shape of the reverse tapered partitions (S1323).

In particular, in the exposing process of step S1322, a halftone photomask or a multi-tone photomask may be used to form the side wall of the partitions in a concave polygonal shape or a concave arc shape. As shown in FIG. 11, partitions having a concave polygonal shape or a concave arc shape provide increased luminance efficiency.

Exposure time or exposure amount may be adjusted to form the side wall of the partitions in a concave polygonal shape or a concave arc shape. In this case, the photomask used in the bank forming process may be used as is without a separate halftone photomask or multi-tone photo mask, which can result in reduction of costs of process and production.

To summarize the fabricating process of FIGS. 13 and 14, a low refractive index reverse taper structure can be formed, or located, on the second substrate (or the upper substrate) in compliance with the emission area of the first substrate (or the lower substrate). The low refractive index reverse taper structure is one example of the partitions used to increase luminance efficiency of a display panel having a mirror or transmission function.

When a negative photoresist organic film material is coated and developed, a reverse taper structure can be formed and a desired luminance viewing angle range can be controlled depending on a taper angle. Thus, it is possible to control a variety of viewing angles of a display panel having a mirror or transmission function, thereby improving the luminance efficiency of the display device.

The organic film can have a thickness such that it is in maximum contact with the bank of the lower substrate and the bank can be formed by a light-absorbing material such that light emitted from each light source is totally reflected at a low refractive index film. Of course, a space may be formed, or located, between the bank and the partitions.

Additionally, the luminance efficiency can be further improved by coating a reflective material on the side wall of the partitions. In addition, in the second substrate, a process of forming, or locating, a color filter, which is lower than or flush with the partitions, in a region corresponding to the emission area, may be added. This can be applied to a display device including a color filter. A sequence of processes of forming partitions and color filters can be determined in various ways.

In addition, in the exemplary embodiments of the present disclosure, because the partitions can be formed by a photomask using the same photomask used to form the bank, it is possible to fabricate a display panel and a display device without employing separate photomasks for the two processes, which can reduce production costs.

In addition, in fabricating the first substrate and the second substrate, it is possible to adjust a viewing angle of a display panel by forming the first substrate in the same way and forming partitions of the second substrate in various ways. For example, a display panel may be classified depending on a viewing angle. Thus, display panels having a narrow viewing angle, a middle viewing angle and a wide viewing angle may be fabricated by separately forming a second substrate for the narrow viewing angle, a second substrate for the middle viewing angle, and a second substrate for the wide viewing angle, while forming a first substrate in common. This allows the reverse taper angle of the partitions to be adjusted, as illustrated in FIG. 9, and includes various embodiments for forming partitions by adjusting exposure time or exposure amount or forming partitions by using a halftone or multi-tone photomask.

The above description and the accompanying drawings provide an example of the technical idea of the present invention for illustrative purposes only. Those having ordinary knowledge in the technical field, to which the present invention pertains, will appreciate that various modifications and changes in form, such as combination, separation, substitution, and change of a configuration, are possible without departing from the essential features of the present invention. Therefore, the embodiments disclosed in the present invention are intended to illustrate the scope of the technical idea of the present invention, and the scope of the present invention is not limited by the embodiment. The scope of the present invention shall be construed on the basis of the accompanying claims in such a manner that all of the technical ideas included within the scope equivalent to the claims belong to the present invention.

What is claimed is:

1. A display panel comprising:
a first substrate on which a plurality of gate lines, a plurality of data lines, a plurality of pixels defined by crossings of the plurality of gate lines and the plurality of data lines, and a plurality of banks are located, wherein the plurality of banks define emission areas of the plurality of pixels; and
a second substrate on which a plurality of partitions are located at positions corresponding to locations of the plurality of banks,
wherein a refractive index of plurality of partitions is lower than a refractive index of a material provided between the emission area and the second substrate,
wherein the gate lines and data lines on the first substrate are made of a transparent conductive material, and
wherein the light transmittance of the region corresponding to the plurality of banks in the second substrate is equal to or higher than the light transmittance of the emission area in the first substrate.

2. The display panel according to claim 1, wherein the material provided between the emission area and the second substrate is an adhesive material, and
wherein the refractive index of the plurality of partitions is lower than a refractive index of the adhesive material.

3. The display panel according to claim 1, wherein a side wall of the partitions has a concave polygonal shape or a concave arc shape.

4. The display panel according to claim 1, wherein a reflective material is located on the second substrate in a region corresponding to each of the plurality of banks of the first substrate.

5. The display panel according to claim 1, wherein a color filter is provided between two partitions, such that the color filter is lower than or flush with the two partitions.

6. A display device comprising:
the display panel of claim 1;
a first driver configured to apply a data signal to the data lines;
a second driver configured to apply a gate signal to the gate lines; and
a timing controller configured to control the first driver and the second driver.

7. The display device according to claim 6, wherein an adhesive material is provided in the emission area, and the adhesive material bonds the first and second substrates together, and
wherein the refractive index of the plurality of partitions is lower than a refractive index of the adhesive material.

8. The display device according to claim 6, wherein the emission area and the bank region in the first substrate are both transparent.

9. A method for fabricating a display panel, comprising:
forming a plurality of gate lines, a plurality of data lines, a plurality of pixels defined by crossings of the plurality of gate lines and data lines and a plurality of banks on a first substrate, wherein the plurality of banks define emission areas of the plurality of pixels;
forming a plurality of partitions located on a second substrate corresponding to locations of the plurality of banks formed on the first substrate; and
bonding the first substrate and the second substrate together,
wherein a refractive index of the plurality of partitions is lower than a refractive index of a material provided between the emission area and the second substrate,
wherein the gate lines and data lines on the first substrate are made of a transparent conductive material, and
wherein the light transmittance of the region corresponding to the plurality of banks in the second substrate is equal to or higher than the light transmittance of the emission area in the first substrate.

10. The method according to claim 9, wherein the step of bonding the first and second substrates further includes forming an adhesive material in the emission area of the first substrate or in a region of the second substrate where no partition is formed,
wherein the refractive index of the plurality of partitions is lower than a refractive index of the adhesive material.

11. The method according to claim 9, wherein the step of forming the plurality of partitions includes:
depositing a negative photoresist on the second substrate; and
exposing the negative photoresist using a photomask corresponding to the bank of the first substrate to form the plurality of partitions.

12. The method according to claim 11, wherein the step of exposing the negative photoresist includes: exposing the negative photoresist by using a halftone photomask or a multi-tone photomask or by adjusting exposure time or exposure amount.

13. The method according to claim 9, further comprising: forming a color filter lower than or flush with the plurality of partitions on the second substrate in a region corresponding to the emission area.

14. A display panel comprising:
a first substrate on which a plurality of gate lines, a plurality of data lines, a plurality of pixels defined by crossings of the plurality of gate lines and the plurality of data lines, and a plurality of banks are located, wherein the plurality of banks define emission areas of the plurality of pixels; and
a second substrate on which a plurality of partitions are located at positions corresponding to locations of the plurality of banks, wherein a refractive index of plurality of partitions is lower than a refractive index of a material provided between the emission area and the second substrate, wherein a lateral side of the partitions has a multi-step reverse taper shape; and wherein the gate lines and data lines on the first substrate are made of a transparent conductive material, and wherein the light transmittance of the region corresponding to the plurality of banks in the second substrate is equal to or higher than the light transmittance of the emission area in the first substrate.

15. The display panel according to claim 14, wherein the material provided between the emission area and the second substrate is an adhesive material, and wherein the refractive index of the plurality of partitions is lower than a refractive index of the adhesive material.

16. The display panel according to claim 14, wherein a reflective material is located on the second substrate in a region corresponding to each of the plurality of banks of the first substrate.

17. The display panel according to claim 14, wherein a color filter is provided between two partitions, such that the color filter is lower than or flush with the two partitions.

* * * * *